(12) United States Patent
Thoerner (10) Patent No.: US 9,912,289 B2
(45) Date of Patent: Mar. 6, 2018

(54) DISTRIBUTOR LOAD CELL FOR DETERMINING PHASE CURRENT IN PHOTOVOLTAIC INSTALLATIONS

(75) Inventor: Carsten Thoerner, Melle (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 21 days.

(21) Appl. No.: 14/239,199

(22) PCT Filed: Aug. 14, 2012

(86) PCT No.: PCT/EP2012/003460
§ 371 (c)(1),
(2), (4) Date: May 1, 2014

(87) PCT Pub. No.: WO2013/023780
PCT Pub. Date: Feb. 21, 2013

(65) Prior Publication Data
US 2014/0311547 A1    Oct. 23, 2014

(30) Foreign Application Priority Data
Aug. 18, 2011    (DE) .......................... 10 2011 110 632

(51) Int. Cl.
*G01R 15/20*        (2006.01)
*G01R 33/07*        (2006.01)
(Continued)

(52) U.S. Cl.
CPC .......... *H02S 50/00* (2013.01); *G01R 19/0092* (2013.01); *H01L 31/02021* (2013.01);
(Continued)

(58) Field of Classification Search
CPC ... H01L 31/02021; H02S 50/10; H02S 50/00; H02S 20/00; H02S 20/32; H02S 40/00;
(Continued)

(56) References Cited

U.S. PATENT DOCUMENTS 5,070,332 A * 12/1991 Kaller ................ H03M 1/0619
341/136
5,092,939 A * 3/1992 Nath .................... E04D 3/3605
136/251
(Continued)

FOREIGN PATENT DOCUMENTS

DE    202005018884    2/2006
DE    102008008503    8/2009
(Continued)

OTHER PUBLICATIONS

English translation of Int. Preliminary Report on Patentability, Int. Serial No. PCT/EP2012/003460, Int. Filing Date: Aug. 14, 2012, Applicant: Phoenic Contatc GmbH & Co. KG et al., dated Feb. 18, 2014.
(Continued)

*Primary Examiner* — Vinh Nguyen
(74) *Attorney, Agent, or Firm* — Reising Ethington P.C.

(57) ABSTRACT

The present disclosure proposes: a distributor measuring box designed to be installed on a photovoltaic solar module, having a housing with a support section embodied to be supported on the solar module, an encompassing side wall, and a cover, and string line feedthroughs and/or string line connectors, and having a string current measuring module that includes a measuring component and an evaluation unit for measuring the string current in the distributor measuring box; a photovoltaic solar module having a plurality of solar cells, in which a distributor measuring box is mounted to the back of the solar module oriented away from the sun; and a photovoltaic system having a plurality of photovoltaic solar modules, having a plurality of string lines, having a generator junction box, and having at least one inverter for supplying the electrical power produced by the photovoltaic generator.

14 Claims, 7 Drawing Sheets

(51) Int. Cl.
  H02S 50/00  (2014.01)
  H01L 31/02  (2006.01)
  G01R 19/00  (2006.01)
  H02G 3/08   (2006.01)
  H02G 3/16   (2006.01)
  H02S 50/10  (2014.01)

(52) U.S. Cl.
  CPC ............. *G01R 15/20* (2013.01); *H02G 3/083* (2013.01); *H02G 3/16* (2013.01); *H02S 50/10* (2014.12); *Y02E 10/50* (2013.01)

(58) Field of Classification Search
  CPC .... H02J 3/383; H02J 1/00; H02J 3/385; H02J 7/35; H02J 1/12; G01R 15/202; G01R 19/2513; G01R 31/006; G01R 31/024; G01R 31/3658
  USPC ..... 324/235, 76.11, 117, 200, 228; 136/243, 136/244
  See application file for complete search history.

(56) References Cited

U.S. PATENT DOCUMENTS

| | | | |
|---|---|---|---|
| 6,093,884 A * | 7/2000 | Toyomura | E04D 3/366 126/621 |
| 6,606,830 B2 * | 8/2003 | Nagao | F24J 2/5228 136/244 |
| 2006/0103547 A1 * | 5/2006 | Salser et al. | 340/870.02 |
| 2006/0162772 A1 * | 7/2006 | Presher et al. | 136/290 |
| 2006/0237058 A1 * | 10/2006 | McClintock | H02J 7/35 136/244 |
| 2007/0252716 A1 * | 11/2007 | Burger | 340/635 |
| 2008/0147335 A1 * | 6/2008 | Adest et al. | 702/64 |
| 2009/0012917 A1 * | 1/2009 | Thompson | G06Q 50/06 705/412 |
| 2009/0078299 A1 * | 3/2009 | Cinnamon | F24J 2/5211 136/244 |
| 2009/0078300 A1 * | 3/2009 | Ang | F03G 6/001 136/244 |
| 2009/0242011 A1 * | 10/2009 | Proisy | H01L 31/02021 136/244 |
| 2010/0085670 A1 | 4/2010 | Palaniswami et al. | |
| 2010/0112851 A1 * | 5/2010 | Giefers | 439/535 |
| 2010/0126550 A1 * | 5/2010 | Foss | 136/244 |
| 2010/0300509 A1 | 12/2010 | Raymond et al. | |
| 2011/0031814 A1 | 2/2011 | Giesler | |
| 2011/0090607 A1 | 4/2011 | Luebke et al. | |
| 2011/0141644 A1 | 6/2011 | Hastings et al. | |
| 2011/0308833 A1 * | 12/2011 | West | H01L 31/02021 174/50.52 |
| 2012/0043988 A1 * | 2/2012 | Ramsey | H02J 13/00 324/761.01 |
| 2012/0299576 A1 * | 11/2012 | Kasai | H01L 31/02021 324/76.11 |
| 2013/0201027 A1 * | 8/2013 | Bucher | H02S 50/10 340/660 |

FOREIGN PATENT DOCUMENTS

| | | |
|---|---|---|
| DE | 202010007997 | 11/2010 |
| DE | 102009054039 | 12/2010 |

OTHER PUBLICATIONS

"ABB Anschlusskasten mit Uberwachung" Flyer Solar-Wechselrichter, May 16, 2011, Seiten 1-2, XP550437000, Gefunden im Internet.

German Office Action, dated Sep. 11, 2012, German Application No. 10 2011 110 632.8, Applicant Name: Phoenix Contact GmbH & Co. KG, Ref No. 11PH0029DEP.

Int. Search Report and Written Opinion, Int. Serial No. PCT/EP2012/003460, Int. Filing Date: Aug 14, 2012, Applicant: Phoenix Contact GmbH & Co. KG, dated Nov 21, 2012.

European Office Action, Serial No. 12 751 263.0-1552, Applicant: Phoenix Contact GmbH & Co., dated Jun. 2, 2017.

* cited by examiner

DISTRIBUTOR LOAD CELL FOR DETERMINING PHASE CURRENT IN PHOTOVOLTAIC INSTALLATIONS

TECHNICAL FIELD

The present disclosure relates to string current determination in photovoltaic systems that takes place in an electrical distributor box for a photovoltaic solar module.

BACKGROUND

In a photovoltaic generator of a photovoltaic system, it is useful to perform a string current measurement of the individual strings of photovoltaic generators. The knowledge of the individual string currents permits inferences to be drawn about the output of solar modules of the individual strings and is an indicator for malfunctions in the system such as the failure of individual solar modules.

For this purpose, the generator control box for each string usually has a shunt resistor built into it, at which it is possible to measure the amount of current contributed by the string line. This is in fact a widely used method, but it has a few disadvantages for which satisfactory solutions have not yet been found.

In this method, it is disadvantageous that for each individual string, the string line must be separately routed to the generator control box, which results in high costs due to the cable lengths required.

Such a centralized current measurement in a generator control box is also disadvantageous in that the thermal output released by the multiple shunt resistors as the current is being measured must be dissipated from the generator control boxes. This may possibly require the use of cooling fans, whose power consumption further reduces the overall output of the photovoltaic generator.

One reason for the string current measurement in the generator control box is that the components required for the string current measurement are accommodated in a way that protects them from moisture.

For example, with photovoltaic systems that have a large and therefore powerful photovoltaic generator or with large cable lengths between the photovoltaic generator and the generator control box, significantly higher costs must be taken into account as a result of the cable lengths that such a design requires. Furthermore, long cable lengths result in a loss for each cable.

Using current measuring modules for installation in the photovoltaic generator junction box also incurs additional costs for the user since these modules must be additionally purchased and installed in the generator junction box.

GENERAL DESCRIPTION

The object of the present disclosure, therefore, is to solve or diminish the problems mentioned above.

Another object of the present disclosure is to provide a redundant string current measuring system for each string of the photovoltaic generator in order to measure the string current in each.

Another object of the present disclosure is to reduce the cable lengths of the string lines.

The object of the present disclosure is attained by the subjects of the independent claims. Advantageous modifications of the present disclosure are defined in the dependent claims.

According to the present disclosure, a distributor measuring box is provided, which accommodates a string current measuring module for measuring the individual string currents. The distributor measuring box has an encompassing side wall, a cover, and a rear support section that is embodied, for example, to be supported on a photovoltaic solar module. The encompassing side wall of the distributor measuring box has openings for routing the end of a string line or a short box string line into the interior of the distributor measuring box or for contacting this line at or in the opening. The rear support section may be prepared for glue-mounting.

The inside of the distributor measuring box also has a string current measuring module with a measuring component and a set of measuring electronics, such as a voltage or current measuring device, mounted on the measuring component. In other words, the current measuring module includes a sensor for measuring the electrical string current and an evaluation unit for evaluating a parameter of the sensor and can therefore be referred to as a current measuring transducer.

The electrical distributor measuring box is preferably attached directly on the underside of a solar module. The attachment of the distributor measuring box directly to the underside of the solar module oriented away from the sun protects the distributor measuring box from climatic influences. In addition, this can simplify the installation in the case of new systems since the distributor measuring boxes can be simply attached, e.g. glued, to the rear part of the solar modules before the solar modules are installed. Such an arrangement is a simple design that makes it possible for the distributor measuring box according to the present disclosure to be retrofitted onto already completed solar modules that already have a junction and connecting box attached to them, into which the electrical conductor bands from the solar module lead.

The distributor measuring box is electrically connected, for example, on one side by means of a box connecting line, which is connected to the junction and connecting box of the solar module, and on the other side by means of a short box string line whose end has a string line connector or in that a string line is routed directly through the string line feedthrough into the distributor measuring box. In order to connect the distributor measuring box to the junction and connecting box, the distributor measuring box can also be plugged directly into the junction and connecting box, for example by means of a measuring box plug connector. In the case of the direct plug connection, the distributor measuring box is therefore situated directly adjacent to the junction and connecting box.

In other words, in this case, two different boxes are mounted on a solar module and electrically connected to each other; the electrical connection is produced either by means of a box string line between the boxes or by means of a measuring box plug connector.

In a particularly preferred embodiment, the string current measuring module and the electrical conductor bands extending out from the solar module are integrated into a joint electrical distributor measuring box. In this preferred embodiment of the present disclosure, in addition to the string current measuring module, the connection of the photovoltaic solar module is also contained in the distributor measuring box. The connection of the photovoltaic solar module includes the conductor bands extending out from the solar module, which convey the electrical power produced by the solar module to the string line. In other words, it therefore constitutes a modified junction and connecting box for a solar module in which the string current measuring module is integrated into the junction and connecting box that is to be mounted onto the solar module.

Such a junction and connecting box includes a support section designed to be supported on the solar module.

Such a junction and connecting box also includes an electrical junction and connecting device, on the one hand with a connecting element on the input side for electrically contacting the conductor bands and on the other with a connecting element on the output side for electrically contacting the box string line or the string line, each for example in the form of connecting terminals, in order to establish the electrical connection between the conductor bands and the string lines when the junction and connecting box is mounted onto the solar module.

The integrated arrangement of the string current measuring module and the connection of the solar module in a junction and connecting box helps to reduce production costs by reducing the number of components required, such as for example two separate box housings and additional external connecting lines.

Furthermore, attaching the string current measuring module in the vicinity of the conductor bands of the solar module can further reduce the electrical loss caused by the string current measuring module, due to the fact that the measurement of the electrical current is performed, for example, directly at the junction and connecting device for the conductor bands extending out from the solar module.

In a preferred embodiment of the string current measuring module in the junction and connecting box of the photovoltaic solar module, the junction connecting device has two respective contact terminals that are connected to each other via a rigid bridge element and are used to produce a detachable connection between the conductor bands on the one hand and the string line on the other. The contact terminals permit the conductor bands of the solar module to be quickly and reliably connected to the string lines in the junction and connecting box. The rigid bridge element is preferably embodied of one piece, e.g. in the form of a stamped and formed metal part, in order to further reduce electrical loss.

In one embodiment, the string current measuring module has a shunt resistor and a voltage measuring device at the shunt resistor; the shunt resistor and the voltage measuring device are preferably accommodated in the junction and connecting box. The shunt resistor is preferably integrated into the rigid bridge element for connecting the string line to the conductor band of the solar module so that the connecting elements are connected to each other via the shunt resistor. This can reduce power loss and production expense since it is possible to use fewer and more compact electrical components.

In another embodiment, the string current measuring module includes a Hall sensor and an associated Hall probe for potential-free measurement of the string current. The Hall sensor preferably includes a toroidal core for a magnetic flux measurement and is mounted, for example, on the rigid bridge element of the junction and connecting device or at the string line feedthrough of the distributor measuring box.

In a particularly preferred embodiment, a magnetoresistive sensor for measuring the string current is included in the string current measuring module. The magnetoresistive sensor can, for example, be mounted on the rigid bridge element of the junction and connecting device or at the string line feedthrough of the distributor measuring box. On the whole, the magnetoresistive sensor permits a low-loss current measurement that generates only a small amount of heat that must be dissipated. In addition, the magnetoresistive sensor is inexpensive to produce. In particular, integrating the magnetoresistive sensor into the junction and connecting box requires no additional contact or components, which interfere with or interrupt the flow of current in the solar module and can cause further power loss.

Through the use of the magnetoresistive sensor and/or Hall sensor, it is therefore possible, even in the event of a failure of the measurement electronics, to deliver the electrical power output from the solar plant to subsequent inverters.

The magnetoresistive sensor is, for example, mounted directly on the rigid bridge element of the junction and connecting device or at one of the string line feedthroughs of the distributor measuring box. The mounting at the string line feedthrough of the distributor measuring box is possible even if the distributor measuring box is not the junction and connecting box of the solar module in which the conductor bands are accommodated. Preferably, the magnetoresistive sensor is of such a small size that it is unnecessary to change the structural shape of the junction and connecting box of the photovoltaic solar module.

Preferably, only one string current measuring module is used or activated for an entire string of the photovoltaic generator. If need be, however, it can also be more advantageous to equip each of the junction and connecting boxes of all of the photovoltaic solar modules with its own respective string current measuring module, in which case it is not necessary to evaluate the parameters output by all of the string current measuring modules.

If several string current measuring modules in one string are simultaneously available for an evaluation, this makes it possible to also provide a redundant measuring operation. This can increase failure safety since a large number of available string current measuring modules can function as a reserve. When using the magnetoresistive sensor, it is therefore possible for the solar plant to continue operating properly even if a sensor failure occurs and it is also possible to continue measuring the string current by reading out the parameters of another string current measuring module in the same string.

The electrical power required for measuring the electrical parameter by means of the string current measuring module is preferably drawn directly from the solar module or the generator string on or in which the string current measuring module is situated. This eliminates the need for additional cabling for supplying power to the string current measuring modules.

Another embodiment of the distributor measuring box includes a radio transmitting device for transmitting the value of the parameter measured by the string current measuring device to a central evaluation unit. These data can also be transmitted via the string cable itself ("power line communication"). Both methods provide a simple, reliable readout of the measuring data generated by the string current measuring module.

The present disclosure also includes a photovoltaic system with a plurality of photovoltaic solar modules; the photovoltaic solar modules are equipped with distributor measuring boxes; in each string of the photovoltaic system, at least one string current measuring module, which is mounted on a solar module in a distributor measuring box, is used to measure the string current.

Preferably, such a photovoltaic system has a central evaluation unit, which is able to detect and evaluate the measuring values generated by the string current measuring modules. An example of such a central evaluation unit is a personal computer, which has receiving and/or transmitting means that are able to connect to the string current measuring module of the distributor measuring box.

The present disclosure will be explained in greater detail below based on exemplary embodiments and in conjunction with the drawings; some elements that are the same or similar have been provided with the same reference numerals; and the features of the different exemplary embodiments can be combined with one another.

DETAILED DESCRIPTION

In general, the present disclosure relates to decentralized string current determination in photovoltaic systems that takes place in an electrical distributor box for a photovoltaic solar module. More specifically, with reference to the drawing figures, the distributor measuring box 2 shown in FIG. 1 has an underside that is embodied to be supported on a solar module and thus constitutes a support section 3. The support section 3 can have fastening holes or can be designed for glue mounting. The distributor measuring box 2 also has an encompassing side wall 5 in which are provided openings 4 for feeding through or connecting string lines, box string lines, or measuring box connecting lines 10, 10a, 12. In other words, a string line can be routed through a string line feedthrough 4a and a string line can be connected to a string line connector 4b, for example by means of a plug connector. In the exemplary embodiment shown in FIG. 1, a line connector 4b is used. The string line 10 in this case connects a first pole of the photovoltaic generator to the distributor measuring box 2, the measuring box connecting line 10a connects the distributor measuring box 2 to the junction and connecting box of the solar module and further to a second electrical pole of the photovoltaic generator; other solar modules can optionally be connected between the respective pole and the distributor measuring box 2.

Figure 1:
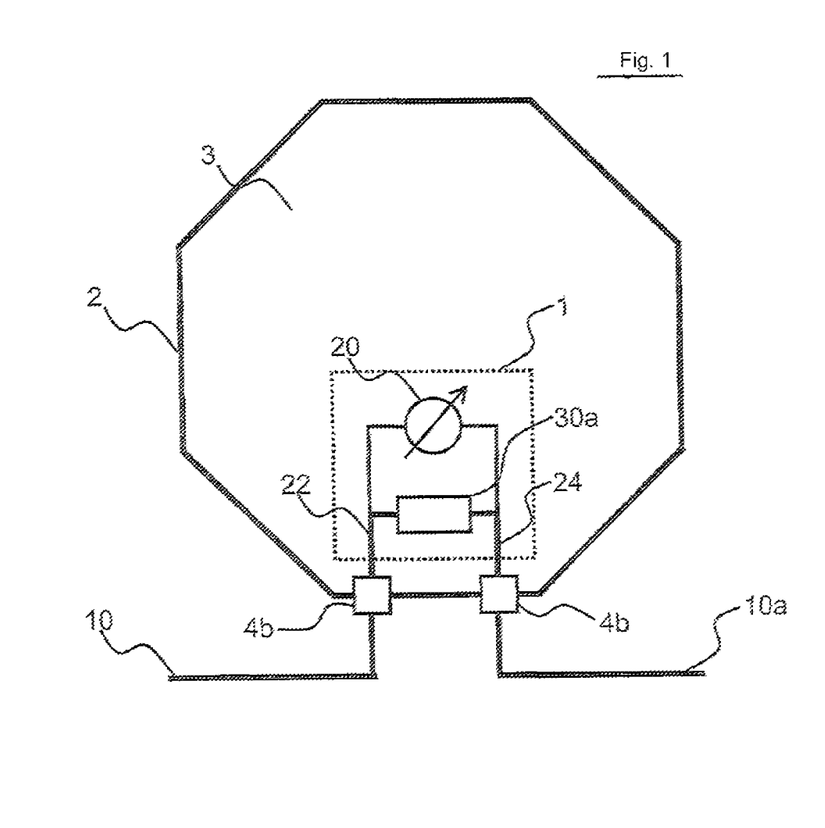
FIG. 1 shows a first embodiment of the distributor measuring box with the string current measuring module.

The distributor measuring box 2 accommodates a string current measuring module 1. In the distributor measuring box 2, a box string line 22 is connected to the string line connector 4b and at its other end, is connected to a measuring component 30; the string line 10 is connected to the string line connector 4b. It is also possible to route the string line 10 through the string line feedthrough 4a and to connect its end directly to the measuring component 30 or to route the box string line 22 in a preinstalled arrangement, out through the string line feedthrough 4a and to equip it with a plug outside the distributor measuring box 2 so that the string line 10 is electrically contacted outside of the distributor measuring box 2. In each case, an electrical connection to the respective electrical pole of the photovoltaic generator is produced; the person skilled in the art will select the connection embodiment that is suitable for the specific application.

In the embodiment shown in FIG. 1, the measuring component 30 is a shunt resistor 30a at which the dropping voltage is measured by means of a voltage measuring device 20. Based on the measured voltage value U and the known resistance value R of the shunt resistor 30a, it is possible to calculate the current I flowing through the shunt resistor 30a.

Another box string line 24 connects the output of the shunt resistor 30a to the string line connector 4b so that the measuring box connecting line 10a permits a connection to be produced to the junction and connecting box of the solar module and further to the second pole of the photovoltaic generator or to other solar modules.

Figure 2:
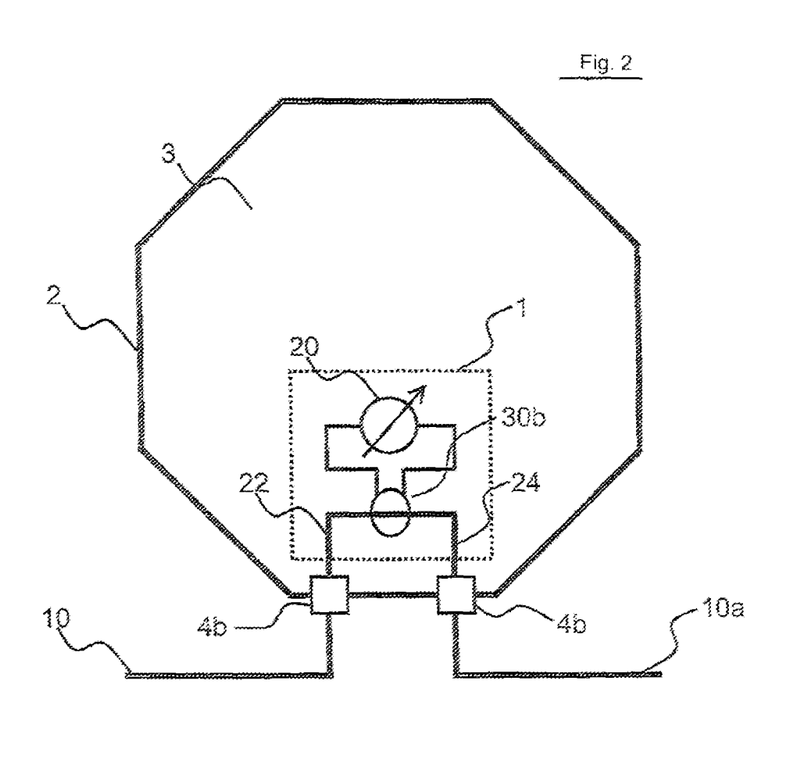
FIG. 2 shows a second embodiment of the distributor measuring box.

In another embodiment of the present disclosure according to FIG. 2, the distributor measuring box 2 contains a toroidal core that functions as a Hall sensor 30b. The toroidal core is connected to a voltage measuring device 20.

Figure 3:
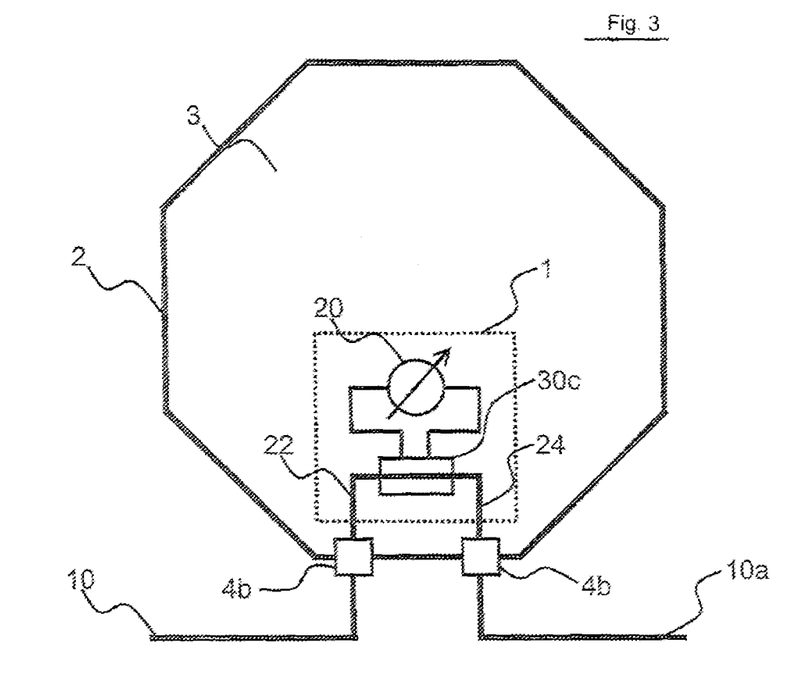
FIG. 3 shows a third embodiment of the distributor measuring box with a magnetoresistive resistor.

FIG. 3 shows a preferred embodiment of the present disclosure in which a magnetoresistive sensor 30c is used as a measuring component 30. The magnetoresistive sensor 30c encompasses the electrical line in such a way that the eddy currents surrounding the electrical conductor are detected. Consequently, the voltage measurement by means of the magnetoresistive sensor 30c is noninvasive, i.e. the string voltage measuring module 1 does not interrupt the string line and a particularly low-resistance measurement is performed.

Figure 4:
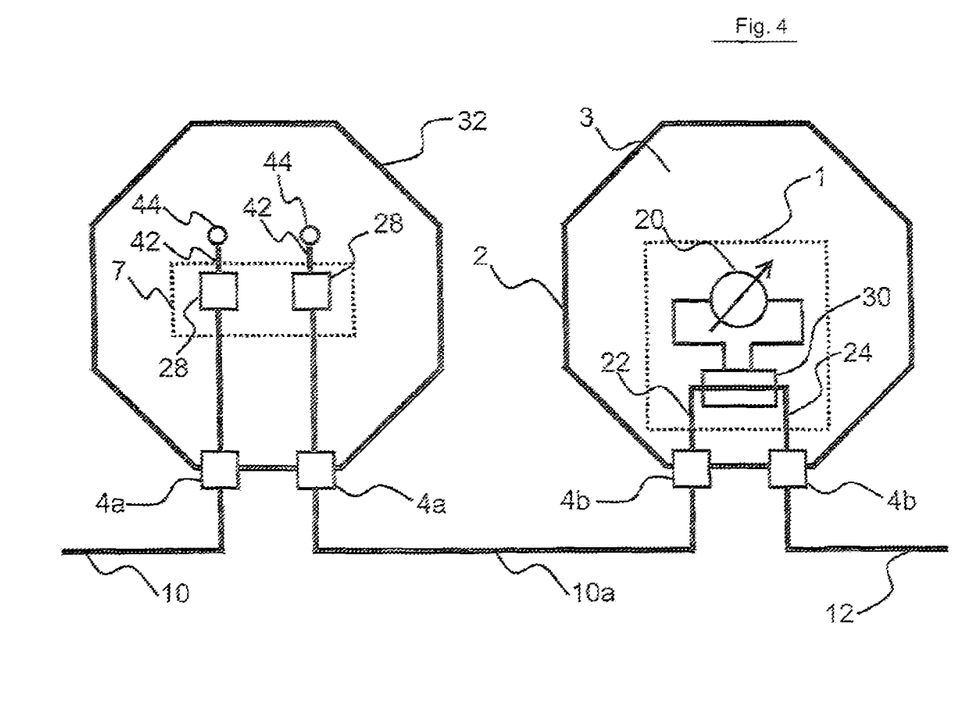
FIG. 4 shows an embodiment intended for retrofitting a solar module, showing a junction and connecting box of the solar module as well as a distributor measuring box.

FIG. 4 shows an embodiment with two separate housings, the distributor measuring box 2 with the string current measuring module 1 and the junction and connecting box 32 in which the electrical conductor bands 42 extending out from the solar module are contacted. The embodiment thus shows the use of the distributor measuring boxes shown in FIGS. 1 through 3 in connection with the junction and connecting box.

The electrical conductor bands 42 extending out from the solar module—which are connected to contacts 44 of the solar module and extend out from the solar module at the point labeled with the reference numeral 44—are contacted in the junction and connecting box 32. The conductor bands 42 are each connected to a connecting element 28 of the junction and connecting device 7.

A first string line 10 connects a first electrical pole of the photovoltaic generator via the string line feedthrough 4a directly to the first connecting element 28 in the junction and connecting box and to the first conductor band 42. The string line 10 in this case is limited to approximately the dimensions of the solar module and at the external end, has a plug for connecting to another string line or to another solar module. The electrical current flow passes through the photovoltaic solar module and the individual solar cells via the second conductor band 42 and the second connecting element 28 to the measuring box connecting line 10a, which connects the junction and connecting box 32 to the distributor measuring box 2 through the string line feedthrough 4a.

The string current measuring module 1 is accommodated in the distributor measuring box 2. The remaining design of the distributor measuring box is identical to the design shown in FIG. 3. A second string line 12 finally connects the distributor measuring box 2 to the second electrical pole of the photovoltaic generator. This embodiment of the present disclosure is particularly suited for retrofitting already existing solar modules or for retrofitting already installed solar plants. The distributor measuring box 2 can be easily glued or fastened in some other way to the underside of already installed solar modules in addition to the existing junction and connecting box 32 and the electrical contact of the first string line 12 can be connected to the retrofitted distributor measuring box 2. The remaining measuring box connecting line 10a restricted to the back side of the solar module is connected to the existing junction and connecting box 32 (see FIG. 7). No further installation work is required.

Figure 5:
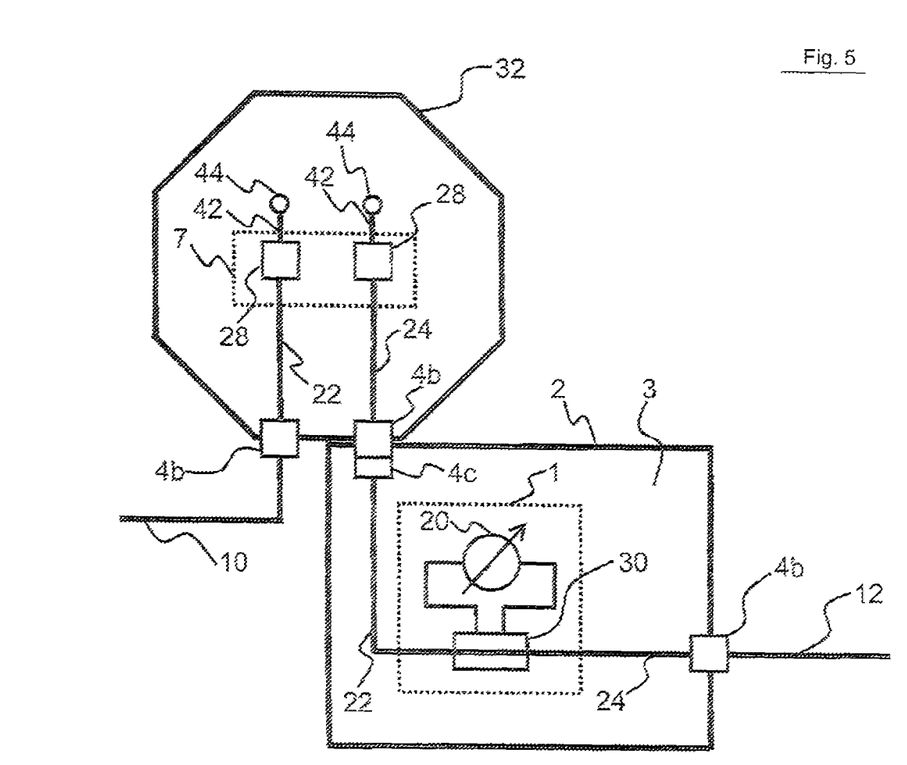
FIG. 5 shows an embodiment analogous to the one shown in FIG. 4, with the junction and connecting box connected to the distributor measuring box via a measuring box plug connector.

FIG. 5 shows an embodiment of the present disclosure with two separate housings in which the distributor measuring box 2 is electrically connected to the junction and connecting box 32 via a measuring box plug connector 4c.

The measuring box plug connector 4c is embodied so that it can be paired with the string line connector 4b; in the example shown, the measuring box plug connector 4c is accommodated in the distributor measuring box 2 and the string line connector 4b is accommodated in the junction and connecting box. In this embodiment, the distributor measuring box 2 is consequently plugged directly into the junction and connecting box 32. The distributor measuring box 2 and the junction and connecting box 32 in this embodiment are situated directly adjacent to each other when they are plugged together. The measuring box plug connector 4c in this case is plugged together with the string line connector 4b. In this example, it is therefore possible to dispense with the measuring box connecting line 10a. Like the example shown in FIG. 3, the distributor measuring box 2 in this embodiment is also equipped with string line connectors 4b for connecting the string lines 10, 12.

Figure 6:
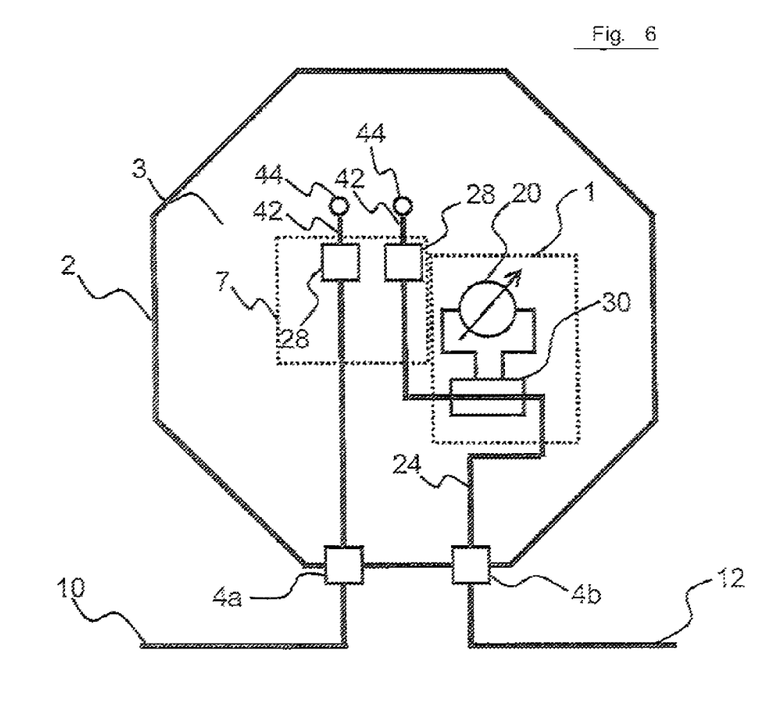
FIG. 6 shows an embodiment of the distributor measuring box in the form of a junction and connecting box of the solar module.

FIG. 6 shows another embodiment of the present disclosure in which the electrical conductor bands 42 extending out from the solar module—which are connected to contacts 44 of the solar module or which extend out from the solar module at the point labeled with the reference numeral 44, respectively—are simultaneously also contacted in the distributor measuring box 2. The conductor bands 42 are each connected to a connecting element 28 of the junction and connecting device. Another end of the connecting element 28 is connected to the string lines 10, 12 by means of the box string lines 22, 24. Consequently, an electrical circuit is formed, leading from the first string line 10 via the box string line 22, the conductor bands 42, the box string line 24, and the additional string line 12.

The string current measuring module 1 is also accommodated in the distributor measuring box 2. The string current measuring module 1 in the exemplary embodiment shown includes the magnetoresistive sensor 30c to which the voltage measuring device 20 is connected in order to measure the induced voltage at the magnetoresistive sensor 30c.

Thus, the entire connecting device required for a solar module is accommodated in a distributor measuring box 2. In other words, the distributor measuring box 2 simultaneously also functions as the junction and connecting box 32 of the solar module. This reduces production, logistics, and assembly costs.

Figure 7:
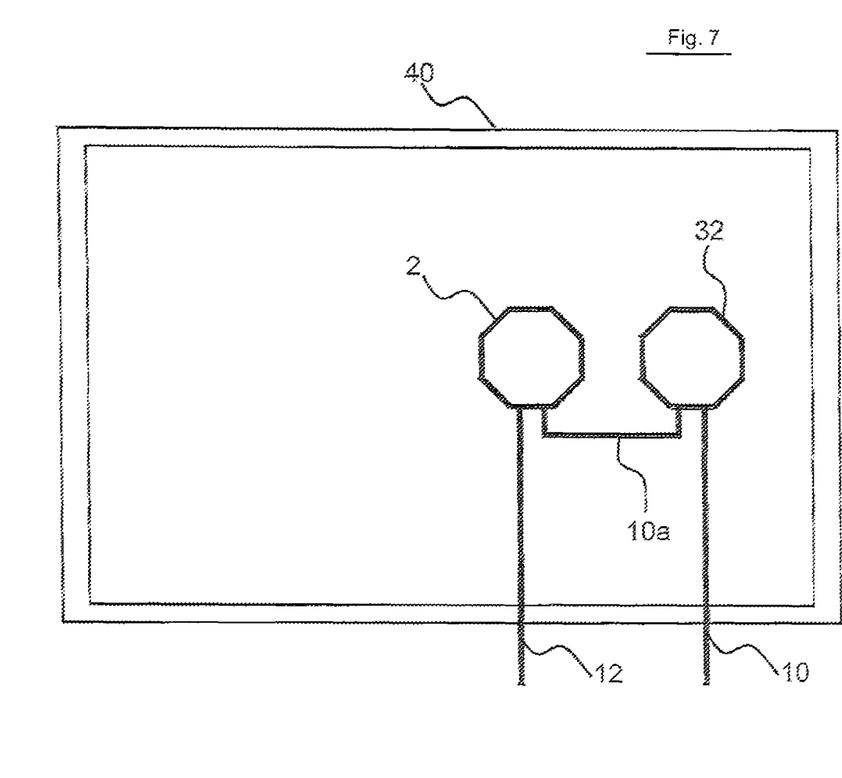
FIG. 7 shows a photovoltaic solar module with a junction and connecting box as well as a distributor measuring box.

FIG. 7 shows the distributor measuring box 2 and the junction and connecting box 32 when mounted to the underside of the solar module 40. The first string line 12 in the embodiment shown is connected to the distributor measuring box 2; the measuring box connecting line 10a, which is restricted to the dimensions of this solar module, connects the distributor measuring box 2 to the junction and connecting box 32; and the string line 10 finally connects the second electrical pole of the photovoltaic generator to the junction and connecting box 32.

It is clear to the person skilled in the art that the embodiments described above are to be understood as examples and that the invention is not limited to them, but can instead be varied in multiple ways without going beyond the scope of the invention. It is also clear that regardless of whether the features are disclosed in the description, the claims, the drawings, or in some other way, they can also define components of the invention individually, even if they have been described together with other features.

The invention claimed is:

1. A string current measuring box to be attached directly on a backside of a photovoltaic solar module, comprising:
    a housing with a support section embodied to be supported on the backside of the photovoltaic solar module, an encompassing side wall, and a cover,
    at least one of string line feedthroughs or string line connectors, and
    a string current measuring module inside the string current measuring box, and comprising a circuit through which string current is measured in the string current measuring box, and also including:
    i) a measuring box connecting line for connecting the string current measuring box to a junction and connecting box of the photovoltaic solar module, or
        a measuring box plug connector with which the string current measuring box can be plugged directly into the junction and connecting box,
        so that the string current measuring box and the junction and connecting box are embodied as separate boxes, each with its own housing for being mounted onto the photovoltaic solar module, or
    ii) a junction and connecting device for electrically contacting conductor bands of the photovoltaic solar module and for producing junctions and connections with a string line or a box string line in order to establish an electrical connection between the conductor bands and the string lines when the string current measuring box is mounted on the photovoltaic solar module in order to deliver electrical power produced by the photovoltaic solar module so that the string current measuring box simultaneously constitutes a junction and connecting box of the photovoltaic solar module.

2. The string current measuring box according to claim 1, wherein the junction and connecting device has two terminals that are connected to each other via a rigid bridge element and are for detachably connecting and electrically contacting the conductor bands and the string line or the box string line.

3. The string current measuring box according to claim 2, wherein the string current measuring module includes a shunt resistor and a voltage measuring device on the shunt resistor in the distributor string current measuring box.

4. The string current measuring box according to claim 3, wherein the shunt resistor is integrated into the rigid bridge element of the junction and connecting device so that the connecting elements of the junction and connecting device are connected to one another electrically via the shunt resistor.

5. The string current measuring box according to claim 1, wherein the string current measuring module includes a Hall sensor and an associated Hall probe for interruption-free measurement of the string current.

6. The string current measuring box according to claim 5, wherein the Hall sensor has a toroidal core for measuring magnetic flux of current flowing through a string line in the string current measuring box and
the Hall sensor is mounted on a rigid bridge element of a junction and connecting device or is mounted at the string line feedthrough of the string current measuring box.

7. The string current measuring box according to claim 1, wherein the string current measuring module includes a magnetoresistive sensor for measuring the string current.

8. The string current measuring box according to claim 7, wherein the magnetoresistive sensor is mounted on a rigid bridge element of a junction and connecting box or is mounted at the string line feedthrough of the string current measuring box so that current can be measured in the string current measuring box based on magnetic flux produced by the string current.

9. The string current measuring box according to claim 1, also including:
a circuit for transmitting values measured by the string current measuring module in the string current measuring box to a central evaluation unit.

10. A photovoltaic solar module with a plurality of solar cells comprising:
a string current measuring box designated to be installed on a photovoltaic solar module that includes a housing with a support section embodied to be supported on the photovoltaic solar module, an encompassing side wall, and a cover, at least one of string line feedthroughs or string line connectors, a string current measuring module inside the string current measuring box, and comprising a circuit through which string current is measured in the string current measuring box, the photovoltaic solar module further comprising:
i) a measuring box connecting line for connecting the string current measuring box to a junction and connecting box of the photovoltaic solar module, or
a measuring box plug connector with which the string current measuring box can be plugged directly into the junction and connecting box,
so that the string current measuring box and the junction and connecting box are embodied as separate boxes, each with its own housing for being mounted onto the photovoltaic solar module, or
ii) a junction and connecting device for electrically contacting conductor bands of the photovoltaic solar module and for producing junctions and connections with a string line or a box string line in order to establish an electrical connection between the conductor bands and the string lines when the string current measuring box is mounted on the photovoltaic solar module in order to deliver electrical power produced by the photovoltaic solar module so that the string current measuring box simultaneously constitutes a junction and connecting box of the photovoltaic solar module,
wherein the string current measuring box is mounted to a backside of the photovoltaic solar module oriented away from the sun.

11. A photovoltaic system with a photovoltaic generator including:
a plurality of photovoltaic solar modules,
a plurality of string lines, and
a string current measuring box installed on a backside of each of the plurality of photovoltaic solar modules,
wherein the string current measuring box includes:
a housing with a support section embodied to be supported on the backside of said photovoltaic solar module, an encompassing side wall, and a cover,
string line feedthroughs and/or string line connectors, and
a string current measuring module inside the string current measuring box, and including a circuit through which string current is measured in the string current measuring box,
each of the plurality of photovoltaic solar modules further comprising:
i) a measuring box connecting line for connecting the string current measuring box to a junction and connecting box of the respective photovoltaic solar module, or
a measuring box plug connector with which the string current measuring box is plugged directly into the junction and connecting box,
so that the string current measuring box and the junction and connecting box are embodied as separate boxes, each with its own housing for being mounted onto the respective photovoltaic solar module, or
ii) a junction and connecting device for electrically contacting conductor bands of the respective photovoltaic solar module and for producing junctions and connections with a string line or a box string line in order to establish an electrical connection between the conductor bands and the string lines when the string current measuring box is mounted on the respective photovoltaic solar module in order to deliver electrical power produced by the respective photovoltaic solar module so that the string current measuring box simultaneously constitutes a junction and connecting box of the respective photovoltaic solar module;
a generator junction box installed apart from the photovoltaic solar modules, and
at least one inverter for supplying electrical power produced by the photovoltaic generator.

12. The photovoltaic system according to claim 11, wherein the photovoltaic system detects and evaluates the values transmitted by string current measuring modules of string current measuring boxes at a computer.

13. The photovoltaic system according to claim 11, wherein a central evaluation unit carries out distributed current measurement at the plurality of photovoltaic solar modules.

14. A method, comprising transmitting to a central evaluation unit, values measured by a string current measuring module in a string current measuring box to be attached directly on a backside of a photovoltaic solar module, and wherein said string current measuring box includes:
a housing with a support section embodied to be supported on the backside of the photovoltaic solar module, an encompassing side wall, and a cover,
at least one of string line feedthroughs or string line connectors, and
a string current measuring module inside the string current measuring box, and comprising a circuit through which string current is measured in the string current measuring box, and also including:
i) a measuring box connecting line for connecting the string current measuring box to a junction and connecting box of the photovoltaic solar module, or
a measuring box plug connector with which the string current measuring box is plugged directly into the junction and connecting box, so that the string current measuring box and the junction and connecting box are embodied as separate boxes, each with its own housing for being mounted onto the photovoltaic solar module, or ii) a junction and connecting device for electrically contacting conductor bands of the photovoltaic solar module and for producing junctions and connections with a string line or a box string line in order to establish an electrical connection between the conductor bands and the string lines when the string current measuring box is mounted on the photovoltaic solar module in order to deliver electrical power produced by the photovoltaic solar module so that the string current measuring box simultaneously constitutes a junction and connecting box of the photovoltaic solar module.

\* \* \* \* \*